United States Patent
Bokisa et al.

(10) Patent No.: US 6,720,499 B2
(45) Date of Patent: Apr. 13, 2004

(54) TIN WHISKER-FREE PRINTED CIRCUIT BOARD

(75) Inventors: George S. Bokisa, North Olmsted, OH (US); Craig V. Bishop, Lakewood, OH (US); John R. Kochilla, Cleveland, OH (US)

(73) Assignee: Atotech Deutschland GmbH, Berlin (DE)

( * ) Notice: Subject to any disclaimer, the term of this patent is extended or adjusted under 35 U.S.C. 154(b) by 84 days.

(21) Appl. No.: 10/002,714

(22) Filed: Nov. 1, 2001

(65) Prior Publication Data

US 2002/0064676 A1 May 30, 2002

Related U.S. Application Data

(62) Division of application No. 09/454,023, filed on Dec. 3, 1999, now Pat. No. 6,361,823.

(51) Int. Cl.[7] .................................................. H05K 1/09
(52) U.S. Cl. ........................ 174/257; 174/256; 427/98
(58) Field of Search ................... 174/257, 255, 174/250, 256, 261, 262, 266; 361/792, 795, 751

(56) References Cited

U.S. PATENT DOCUMENTS

| | | | |
|---|---|---|---|
| 4,093,466 A | 6/1978 | Davis | |
| 4,194,913 A | 3/1980 | Davis | |
| RE30,434 E * | 11/1980 | Davis | 106/1.22 |
| 4,263,106 A | 4/1981 | Kohl | |
| 4,657,632 A | 4/1987 | Holtzman et al. | |
| 4,715,894 A * | 12/1987 | Holtzman et al. | 106/1.22 |
| 4,749,626 A | 6/1988 | Kadija et al. | 428/647 |
| 4,758,459 A * | 7/1988 | Mehta | 428/131 |
| 4,770,921 A * | 9/1988 | Wacker et al. | 428/209 |
| 4,935,312 A * | 6/1990 | Nakayama et al. | 428/642 |
| 4,959,278 A * | 9/1990 | Shimauchi et al. | 428/642 |
| 5,039,576 A | 8/1991 | Wilson | |
| 5,160,422 A | 11/1992 | Nishimura et al. | |
| 5,196,053 A | 3/1993 | Dodd et al. | |
| 5,296,649 A * | 3/1994 | Kosuga et al. | 174/250 |
| 5,322,553 A * | 6/1994 | Mandich et al. | 106/1.23 |
| 5,435,838 A * | 7/1995 | Melton et al. | 106/1.22 |
| 5,554,211 A | 9/1996 | Bokisa et al. | |
| 5,733,599 A * | 3/1998 | Ferrier et al. | 427/98 |
| 5,935,640 A | 8/1999 | Ferrier et al. | |
| 6,110,608 A * | 8/2000 | Tanimoto et al. | 428/647 |
| 6,329,722 B1 * | 12/2001 | Shih et al. | 257/786 |
| 6,395,329 B2 * | 5/2002 | Soutar et al. | 427/98 |

FOREIGN PATENT DOCUMENTS

| | | |
|---|---|---|
| JP | 59-31886 | 2/1984 |
| JP | 59-35694 | 2/1984 |

* cited by examiner

*Primary Examiner*—Kamand Cumeo
*Assistant Examiner*—I B Patel
(74) *Attorney, Agent, or Firm*—Renner, Otto, Boisselle & Sklar, LLP (57) ABSTRACT

A printed circuit board including electrical circuitry formed on an outer surface of the printed circuit board, the circuitry comprising copper or a copper alloy; a final finish on the circuitry, the final finish including a coating of tin on the copper or copper alloy circuitry; and an alloy cap layer on the tin coating, the alloy cap layer comprising at least two immersion-platable metals. The immersion platable metals in the alloy cap layer may be at least two metals selected from tin, silver, bismuth, copper, nickel, lead, zinc, indium, palladium, platinum, gold, cadmium, ruthenium and cobalt. The circuitry remains whisker free and solderable.

29 Claims, 1 Drawing Sheet

Fig. 1

TIN WHISKER-FREE PRINTED CIRCUIT BOARD

CROSS REFERENCE TO RELATED APPLICATIONS

The present application is a division of and claims priority under 35 U.S.C. 120 to U.S. application Ser. No. 09/454,023, filed Dec. 3, 1999 U.S. Pat. No. 6,361,823.

FIELD OF THE INVENTION

This invention relates to a process for depositing a first coating of substantially pure tin and a second or subsequent cap layer of one or more alloys of at least two immersion platable metals selected from tin, silver, bismuth, copper, nickel, lead, zinc, indium, palladium, platinum, gold, cadmium, ruthenium and cobalt onto a metal surface such as copper or copper alloys used, e.g., for electrodes or various electronic circuit elements. More particularly, this invention relates to immersion plating of a first coating of substantially pure tin and at least one cap layer of an alloy comprising at least two of the above immersion platable metals on copper, copper alloys, and other metals on printed circuit boards by chemical displacement using an electroless immersion, spray, flood or cascade plating application process. Still more particularly, this invention relates to the use of such plating solutions in the manufacture of printed circuit boards.

BACKGROUND OF THE INVENTION

Coatings of tin, lead, bismuth, and alloys thereof have been applied to surfaces of copper and copper-based alloys by displacement plating such as by immersion plating techniques. Chemical displacement plating has been used in the manufacture of printed circuit boards (PCB's) and particularly multilayer printed circuit boards. Printed circuit boards generally comprise a non-conducting or dielectric layer such as a fiberglass/epoxy sheet which is clad with a metal conductive layer such as copper or a copper alloy on one or both surfaces. The metal layer on the PCB, before processing, typically is a continuous layer of copper which may be interrupted by a pattern of plated through-holes linking both surfaces of the board. During processing, selected portions of the copper layer are removed to form a raised copper circuit image pattern, i.e., circuitry. Multilayer PCB's are typically constructed by inter-leaving imaged conductive layers such as one containing copper with dielectric adhesive layers such as a partially cured B-stage resin, i.e., a prepreg, into a multilayer sandwich which is then bonded together by applying heat and pressure. Production of these types of PCB's is described in "Printed Circuits Handbook," Fourth Edition, Edited by C. F. Coombs, Jr., McGraw-Hill, 1996, which is incorporated herein by reference. Since the conductive layer with a smooth copper surface does not bond well to the prepreg, copper surface treatments have been developed to increase the bond strength between the layers of the multilayer PCB sandwich.

In addition to problems associated with adhesion of copper to laminating materials, PCBs also must be treated in order to preserve the solderability of exposed conductors. PCBs are generally fabricated in a "finished" form by a board fabricator and shipped lacking certain circuit elements, which are later added by an assembly house. Therefore, in a finished PCB, some circuitry must be left exposed for later attachment, usually by soldering, of further circuit elements. It is critical that such conductors retain good solderability. Copper and copper alloy conductors have previously been coated with tin or tin alloys to preserve solderability. However, electrodeposited pure tin is subject to "whiskering", a phenomenon well known in the PCB industry. Tin alloys, such as tin/lead have been used to avoid the whiskering problem, but have the problems of expense (alloys including precious metals) or environmental unfavorability (lead).

Hot air solder leveling ("HASL") has been used as a final finish for the exposed circuitry on finished PCBs. HASL produces a thick layer, e.g., 35 $\mu$in to 60 $\mu$in, which insures long-term solderability. The drawback to HASL is that the solder, particularly tin/lead solder, assumes a non-planar dome or dome-like shape on cooling. This non-planar shape makes subsequent placement of surface mount devices problematic.

Thin deposits (1–4 microinch ($\mu$in) deposits of immersion tin have been used with silane in multilayer bonding processes to aid bonding between the metal circuitry and the laminating materials. However, this process is self-limiting as to thickness and the deposited tin rapidly alloys with copper.

Thick, pure electrodeposited tin is known to be prone to whiskering.

Rapid deposition, high build immersion tin ("RDHBIT" has been suggested as an alternative to HASL as a final finish for PCBs. RDHBIT has been used as a replacement for HASL because it is a low cost alternative to alloys such as Ni/Au, immersion silver, immersion palladium or organic solderability preservatives.

It has been a common belief in the industry that RDHBIT is non-whiskering. However, the present inventor has discovered that this belief is erroneous, and that RDHBIT deposits from every manufacturer are subject to latent tin whiskering. When a pure or substantially pure tin deposit is subjected to a temperature of 130° C. for a period of 70 hours in an open air oven, it develops tin whiskers. The present inventor has discovered that even RDHBIT develops whiskers. This previously unrecognized problem with immersion tin may have contributed to unexplained failures of PCBs as a result of such whiskering, and is in need of a solution.

SUMMARY OF THE INVENTION

It has now been discovered that, by applying to a substrate, e.g., to a finished PCB, a first coating of tin from an immersion tin plating solution followed by applying a cap layer of an alloy of at least two immersion platable metals onto the tin coating, a high degree of solderability can be preserved, and the problem of tin whiskering can be avoided.

In one embodiment, the present invention relates to a process for preserving solderability and inhibiting tin whisker growth of tin coated copper or copper alloy surfaces on a substrate. The process includes the steps of:

(A) preparing an immersion tin plating solution;
(B) applying the immersion tin plating solution to the substrate to form a tin coating on the surfaces;
to (C) preparing an immersion alloy plating solution containing at least two immersion-platable metals;
(D) applying the immersion alloy plating solution to the substrate to form an alloy cap layer on the tin coating. In another embodiment, the steps (B) and (D) the solution is applied by immersing the substrate in the respective solution. In another embodiment, the immersion platable metals are present in the form of metal salts.

In one embodiment, the substrate is a finished printed circuit board. In another embodiment, the immersion-platable metals are selected from tin, silver, bismuth, copper, nickel, lead, zinc, indium, palladium, platinum, gold, cadmium, ruthenium and cobalt. In another embodiment, the at least two immersion platable metals comprise tin and silver.

In one embodiment, the tin coating has a thickness in the range from about 20 microinches to about 300 microinches. In another embodiment, the tin coating has a thickness in the range from about 40 microinches to about 60 microinches.

In one embodiment, the alloy cap layer has a thickness in the range from about 1 microinch to about 30 microinches. In another embodiment, the alloy cap layer has a thickness in the range from about 2 microinches to about 10 microinches.

In one embodiment, the step of applying the immersion tin plating solution includes a plating time in the range of about 5 to about 60 minutes.

In one embodiment, the step of applying the immersion alloy plating solution includes a plating time in the range of about 1 to about 10 minutes.

In one embodiment, the immersion tin plating solution comprises a stannous salt, an acid selected from mineral acids, carboxylic acids and hydrocarbyl-substituted sulfonic acids, a complexing agent and water. In another embodiment, the stannous salt is a stannous salt of a hydrocarbyl-substituted sulfonic acid and the acid is the hydrocarbyl-substituted sulfonic acid.

In one embodiment, the immersion alloy plating solution comprises at least two immersion-platable metal salts, an acid selected from mineral acids, carboxylic acids and hydrocarbyl-substituted sulfonic acids, a complexing agent and water. In another embodiment, each of the at least two immersion platable metal salts is a salt of a hydrocarbyl-substituted sulfonic acid and the acid is the hydrocarbyl-substituted sulfonic acid.

In one embodiment, the process for preserving solderability and inhibiting tin whisker growth of tin coated copper or copper alloy surfaces on a substrate, comprising the steps of:

(A) preparing an immersion tin plating solution;

(B) applying the immersion tin plating solution to the substrate to form a tin coating on the surfaces;

(C) preparing an immersion alloy plating solution containing tin and silver;

(D) applying the immersion alloy plating solution to the substrate to form a tin/silver alloy cap layer on the tin coating. In another embodiment, the tin/silver alloy cap layer comprises from about 50 wt % to about 98 wt % tin and from about 50 wt % to about 2 wt % silver. In another embodiment, the tin/silver alloy cap layer comprises from about 80 wt % to about 95 wt % tin and from about 20 wt % to about 5 wt % silver.

In one embodiment, the printed circuit board includes electrical circuitry formed on an outer surface of the printed circuit board, the circuitry comprising copper or a copper alloy; a final finish on the circuitry, the final finish comprising a coating of tin on the copper or copper alloy circuitry; and an alloy cap layer on the tin coating, the alloy cap layer comprising at least two immersion-platable metals. In another embodiment, the alloy cap layer comprises an alloy of tin and silver.

Figure 1:
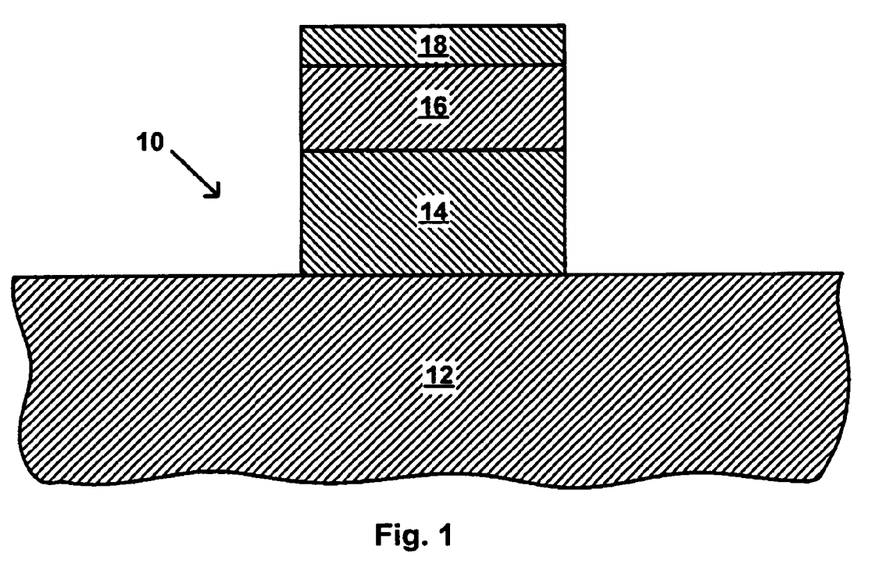
FIG. 1 is a schematic, cross-sectional view of a substrate including electrical circuitry, a coating of tin and an alloy cap layer on the tin coating, in accordance with an embodiment of the present invention.

It should be appreciated that for simplicity and clarity of illustration, elements shown in the FIG. have not necessarily been drawn to scale. For example, the dimensions of some of the elements may be exaggerated relative to each other for clarity.

FIG. 1 is a schematic, crass-sectional view of a device 10, such as a printed circuit board, in accordance with an embodiment of the present invention. The device 10 includes a substrate 12, on which is formed electrical circuitry 14. The device 10 further includes a tin coating 16 formed on the electrical circuitry 14 An alloy cap layer 18 is formed on the tin coating 16, in which the alloy cap layer 18 includes at least two immersion-platable metals.

DESCRIPTION OF THE PREFERRED EMBODIMENTS

The methods of the present invention preserve solderability and inhibit tin whiskering of tin-coated copper or copper alloy surfaces of substrates such as PCBs by use of a first immersion tin plating solution and a second immersion alloy plating solution comprising at least two immersion platable metals selected from tin, silver, bismuth, copper, nickel, lead, zinc, indium, palladium, platinum, gold, cadmium, ruthenium and cobalt. From the immersion tin solution, a first coating of immersion tin is deposited on a copper or copper alloy substrate. The immersion tin plating solution is substantially free of other immersion platable metals, and, as a result, the tin coating applied to the copper or copper alloy surfaces of the PCB is substantially pure tin. From the immersion alloy plating solution, a cap layer of an alloy of at least two immersion-platable metals is deposited on the tin coating. The immersion alloy plating solutions contain at least two metals selected from tin, silver, bismuth, copper, nickel, lead, zinc, indium, palladium, platinum, gold, cadmium, ruthenium and cobalt. The alloy cap layer comprises alloys of metals such as tin/silver, tin/lead, tin/bismuth, tin/indium, lead/bismuth, tin/germanium, indium/gallium, tin/lead/bismuth, tin/gallium/germanium, etc.

The metals are present in the respective immersion plating solutions as water-soluble salts including the oxides, nitrates, halides, acetates, fluoborates, fluosilicates, alkane sulfonates and alkanol sulfonates of the respective metals. In one embodiment, the anion of the metal salt corresponds to the anion of the acid used in the plating solution. For example, when fluoboric acid is used as the acid, the salts may be, for example, stannous fluoborate, silver fluoborate, lead fluoborate, bismuth fluoborate, indium fluoborate, gallium fluoborate and germanium fluoborate. When the acid used in the solution is a hydrocarbyl-substituted sulfonic acid, e.g., an alkane or an alkanol sulfonic acid, the soluble metal salt may be, for example, tin methane sulfonate, silver methane sulfonate, lead methane sulfonate, bismuth methane sulfonate, indium methane sulfonate, etc., and mixtures thereof in the case of the immersion alloy plating solutions, and the corresponding acid is methane sulfonic acid.

As used herein, the term "immersion-platable metal" is defined as a metal which can be deposited on the surface of a substrate by an electroless plating process, for example by immersion, spraying, dipping or cascading a solution thereof on the substrate. Immersion platable metals include at least tin, silver, bismuth, copper, nickel, lead, zinc, indium, palladium, platinum, gold, cadmium, ruthenium and cobalt.

The methods of the present invention apply generally to non-electrolytic plating methods, which may include electroless plating, immersion plating, and other forms of plating which proceed in the absence of an applied electric potential between the plating solution and the substrate. Such methods include contact between the solution and the substrate as a result of immersion or dipping the substrate into the solution, and spraying or cascading of the solution upon the substrate, as well as electroless plating which proceeds with the aid of a secondary reducing agent.

The method of the present invention applies a final finish to a substrate which comprises copper or a copper alloy. In one embodiment, the final finish is applied to a PCB in which the copper or copper alloy forms the circuitry on the PCB. In another embodiment the final finish is applied to a finished PCB. As used herein, a final finish is the final, protective coating applied to the copper or copper alloy surfaces, i.e., the circuitry, such as conductors of a PCB, which would otherwise be left exposed. A finished PCB is a PCB which has been completed by the board fabricator, but upon which not all electrical or electronic components have been installed or attached. Such components are generally installed or attached by soldering, and this installation or attachment is performed by, e.g., an assembly house which has received the finished PCB from the board fabricator. The method of the present invention preserves the solderability of the conductors and inhibits tin whispering of the protective tin coating during the interim between manufacture of the finished PCB and the installation or attachment of further components thereon by the assembly house.

The method of the present invention deposits a first, relatively heavy tin coating to the substrate. The tin coating is substantially pure tin. As used herein, the term "substantially pure tin" means a tin which is substantially free of added immersion platable metals other than tin. A substantially pure tin contains less than 1 wt % of other immersion platable metals, whether such metals are added intentionally or present as impurities in the immersion tin plating solution. More preferably, a substantially pure tin contains less than about 0.1 wt % of other immersion platable metals. Thus, other immersion platable metals are not intentionally added to the immersion tin plating solution. However, small amounts of such immersion platable metals may be present as impurities. Such amounts may be as high as 1 wt %, but should be less than about 0.1 wt %.

The following description of immersion plating solutions useful in the method of the present invention is applicable both to the solutions containing substantially only tin (solutions of tin substantially free of other immersion-platable metals) and to the solutions containing at least two immersion platable metals selected from tin, silver, bismuth, copper, nickel, lead, zinc, indium, palladium, platinum, gold, cadmium, ruthenium and cobalt, except as may be otherwise specified with respect to each particular immersion plating solution.

In one embodiment, the immersion tin plating solution comprises a stannous salt, an acid selected from mineral acids, carboxylic acids and hydrocarbyl-substituted sulfonic acids, a complexing agent and water. In another embodiment, the stannous salt is a stannous hydrocarbyl-substituted sulfonate and the acid is a hydrocarbyl-substituted sulfonic acid.

In one embodiment, the immersion alloy plating solution comprises at least two immersion-platable metal salts, an acid selected from mineral acids, carboxylic acids and hydrocarbyl-substituted sulfonic acids, a complexing agent and water. In another embodiment, the immersion-platable metal salts are salts of a hydrocarbyl-substituted sulfonate and the acid is a hydrocarbyl-substituted sulfonic acid. In another embodiment, the immersion-platable metal salts are silver salts and tin salts and the alloy cap layer is an alloy of tin and silver.

The amount of tin (as tin metal) in the immersion tin plating solutions of the present invention may be varied over a wide range such as from about 1 to about 120 grams of metal per liter of solution (g/l), or up to the solubility limit of the particular tin salt in the particular solution. In one embodiment, the tin is present in the range from about 5 g/l to about 80 g/l. In another embodiment, the tin is present in the range from about 10 g/l to about 50 g/l. In another embodiment, the tin is present in an amount from about 20 g/l to about 40 g/l. In another embodiment, the tin is present in an amount of about 30 g/l. In another embodiment, the tin is present in an amount of about 20 g/l. Higher levels of tin may be included in the plating solutions, but economics suggest, and solubility may dictate, that the metal levels be maintained at lower levels. It should be understood that the foregoing quantities of tin in the immersion tin plating solution are disclosed as metallic tin, but that the tin may be added to the solutions in the form of tin compounds. Such compounds may include, for example, tin oxide, tin salts, or other soluble tin compounds. In one embodiment, the tin compounds are tin salts.

The amount of each of the at least two immersion platable metals in the immersion alloy plating baths is in the range from about 2 g/l to about 120 g/l. In one embodiment, each immersion platable metal is present in the range from about 3 g/l to about 50 g/l. In another embodiment, each immersion platable metal is present in an amount from about 5 g/l to about 20 g/l. In one embodiment, each immersion platable metal is present in the range from about 10 g/l to about 15 g/l. In another embodiment, each immersion platable metal is present in an amount from about 5 g/l to about 15 g/l. In another embodiment, each immersion platable metal is present in an amount of about 10 g/l. In another embodiment, each immersion platable metal is present in an amount of about 5 g/l. Higher levels of each immersion platable metal may be included in the plating solutions, but economics suggest, and solubility may dictate, that the immersion platable metal levels be maintained at the lower levels. It should be understood that the foregoing quantities of each immersion platable metal in the immersion alloy plating solutions are disclosed as being in the metallic form, but that the immersion platable metals may be added to the solutions in the form of metal compounds. Such compounds may include, for example, metal oxides, metal salts, or other soluble metallic compounds. In one embodiment, the immersion platable metal compounds are metal salts.

The relative amounts of each of the at least two immersion-platable metals in the alloy cap layer range from about 1 wt % to about 99 wt % each. In one embodiment, the alloy is a tin alloy and comprises from about 50 wt % to about 99 wt % tin. In another embodiment, the alloy is a tin alloy and comprises from about 80 wt % to about 98 wt % tin. In one embodiment, the alloy is a tin alloy and comprises from about 90 wt % to about 95 wt % tin. In another embodiment, the alloy is an alloy of tin and silver. In another embodiment, the alloy contains from about 50 wt % to about 99 wt % silver, with the remainder tin. In another embodiment, the alloy contains from about 90 wt % to about 97 wt % silver, with the remainder tin. In another embodiment, the alloy contains about 95 wt % silver, with the remainder tin.

A second component of the immersion plating solutions of the present invention is at least one acid selected from carboxylic acids, fluoboric acid, hydrocarbyl-substituted sulfonic acids, hydroxyhydrocarbyl-substituted sulfonic acids, phosphorus- and sulfur-based acids, and mixtures thereof. Such phosphorus- and sulfur-based acids include phosphoric and sulfuric acids.

The amount of acid contained in the solutions may vary from about 20 to about 500 grams of acid per liter of solution (g/l). In one embodiment, the plating solutions contain from about 50 g/l to about 150 g/l. In another embodiment, one or more organic acids are present in the range from about 200 g/l to about 400 g/l. In another embodiment, the organic acid is citric acid. In another embodiment, the organic acid is tartaric acid. In another embodiment, the organic acid comprises a mixture of tartaric and citric acids. In another embodiment, methane sulfonic acid is present in an amount from about 50 g/l to about 150 g/l. In another embodiment, methane sulfonic acid is present in an amount from about 60 g/l to about 100 g/l. In another embodiment, methane sulfonic acid is present in an amount of about 70 g/l. In another embodiment, methane sulfonic acid is present in an amount of about 100 g/l. In another embodiment, fluoboric acid is present in an amount of about 70 g/l. In another embodiment, fluoboric acid is present in an amount of about 100 g/l. In another embodiment, sulfuric acid is present in an amount of about 150 g/l.

Sufficient acid is present in the aqueous plating solutions to provide the solution with a pH of from about 0 to about 3. In one embodiment, the pH is from about 0 to about 2. In another embodiment, the pH is from about 0 to about 1. In another embodiment, the pH is in the range from about 0 to about $-1$. Generally, it is desirable to use an acid that has an anion common to the acid salts of the metals.

The alkane sulfonic acids which are useful in the present invention as the anion of the metal salts or as the acid component may be represented by the following Formula I $$RSO_3H \quad (I)$$

wherein R is an alkyl group containing from about 1 to about 12 carbon atoms and more preferably, from about 1 to 6 carbon atoms. Examples of such alkane sulfonic acids include, for example, methane sulfonic acid, ethane sulfonic acid, propane sulfonic acid, 2-propane sulfonic acid, butane sulfonic acid, 2-butane sulfonic acid, pentane sulfonic acid, hexane sulfonic acid, decane sulfonic acid and dodecane sulfonic acid. Immersion platable metal salts of the individual alkane sulfonic acids or mixtures of any of the above alkane sulfonic acids can be utilized in the immersion plating solutions of the invention.

The alkanol sulfonic acids may be represented by the following Formula II:

$$C_nH_{2n+1}-CH(OH)-(CH_2)_m-SO_3H \quad (II)$$

wherein n is from 0 to about 10, m is from 1 to about 11 and the sum of m+n is from 1 up to about 12. As can be seen from the above Formula II, the hydroxy group may be a terminal or internal hydroxy group. Examples of useful alkanol sulfonic acids include 2-hydroxy ethyl-1-sulfonic acid, 1-hydroxy propyl-2-sulfonic acid, 2-hydroxy propyl-1-sulfonic acid, 3-hydroxy propyl-1-sulfonic acid, 2-hydroxy butyl-1-sulfonic acid, 4-hydroxy butyl-1-sulfonic acid, 2-hydroxy-pentyl-1-sulfonic acid, 4-hydroxy-pentyl-1-sulfonic acid, 2-hydroxy-hexyl-1-sulfonic acid, 2-hydroxy decyl-1-sulfonic acid, 2-hydroxy dodecyl-1-sulfonic acid.

The alkane sulfonic acids and alkanol sulfonic acids are available commercially and can also be prepared by a variety of methods known in the art. One method comprises the catalytic oxidation of mercaptans or aliphatic sulfides having the formula $R_1S_nR_2$ wherein $R_1$ or $R_2$ are alkyl groups and n is a positive integer between 1 and 6. Air or oxygen may be used as the oxidizing agent, and various nitrogen oxides can be employed as catalysts. The oxidation generally is effected at temperatures below about 150° C. Such oxidation processes are described and claimed in U.S. Pat. Nos. 2,433,395 and 2,433,396. Alternatively, chlorine can be used as the oxidizing agent. The metal salts of such acids are prepared, for example, by dissolving a metal oxide in a hot concentrated aqueous solution of an alkane or alkanol sulfonic acid. Mixtures of any of the above-described acids may be used, and an example of a useful mixture is a mixture of fluoboric acid and methane sulfonic acid.

A third component of the immersion plating solutions of the present invention is a complexing agent. The complexing agent may be an imidazole-2-thione compound of the Formula III:

(III)

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety.

In one embodiment, the complexing agent is a 1,3-dialkylimidazole-2-thione compound (where A and B are each individually alkyl or cycloalkyl groups), and the thione compound may be unsymmetrical (A and B are different) or symmetrical (A and B are the same). In another embodiment, the complexing agents are unsymmetrical such as (where A is methyl or ethyl and B is an alkyl or cycloalkyl group containing from 3 to 6 carbon atoms). In another embodiment, when A is methyl, B is a $C_3$–$C_6$ alkyl or cycloalkyl group, and when A is ethyl, B is a $C_4$–$C_6$ alkyl or cycloalkyl group. An example of an unsymmetrical compound is 1-methyl-3-propylimidazole-2-thione.

Alternatively, symmetrical 1,3-dialkylimidazole-2-thione compounds may be utilized in the immersion plating solutions of the present invention, and the dialkyl groups are the same alkyl or cycloalkyl groups containing from 1 to 6 carbon atoms. An example of this class of complexing agents is 1,3-dimethylimidazole-2-thione.

In another embodiment, the complexing agent is thiourea, structure (IV):

(IV)

In other embodiments, the complexing agent may be a thiourea compound. Thiourea compounds include those disclosed in U.S. Pat. No. 4,715,894, which is incorporated herein by reference. Suitable thiourea compounds comprise thiourea and the various art known derivatives, homologs, or analogs thereof.

Compounds that may be employed in this respect comprise 2,4-dithiobiuret; 2,4,6-trithiotriuret; alkoxy ethers of isothiourea; thiocyanuric acid (trimer of thiourea); thioammelide (trimer of thiourea); monoalkyl or dialkyl thiourea, where the alkyl group comprises a lower alkyl group, having up to about four carbon atoms such as diethyl thiourea or monoethyl thiourea; saturated or unsaturated cyclic hydrocarbons mono- or di-substituted thioureas such as naphthyl thiourea, diphenyl thiourea, cyclohexyl thiourea and the like, where the cyclic hydrocarbon has up to about ten carbon atoms; the disulfide of thiourea; thio-imidol (the reaction product of thiourea and sodium hydroxide); thiocarbamic acid esters (the reaction products of thiourea and an alcohol comprising $R^4OH$ where $R^4$ is a saturated or unsaturated aliphatic or cyclic group having up to about ten carbon atoms) the oligomers of thiourea and formaldehyde, e.g. monomethylol, dimethylol, and trimethylol thioureas; S-alkyl pseudo thioureas (manufactured by the reaction of thiourea with an iodo- lower alkane such as iodomethane where the lower alkyl group contains up to about five carbon atoms); thiocarbonic acid esters of thiourea and $R^5OH$, (where $R^5$ is defined as (a) alkyl or alkenyl having up to about 6 carbon atoms; (b) aryl, aralkyl, or alkaryl having up to about 12 carbon atoms; or (c) cycloalkyl, cycloalkylalkyl, or alkylcycloalkyl having up to about 12 carbon atoms), and especially where $R^5$ is lower alkyl; thioureadioxide (also known a formamidinesulfinic acid [C.A.Reg.No. 1758-73-2]); the reaction product of a saturated or unsaturated aliphatic or cyclic organic acid having up to about 12 carbon atoms and especially the lower aliphatic monocarboxylic acid reaction products with thiourea, e.g., acylthioureas, and the mineral acid salts of thiourea e.g. thiourea mono- or di-sulfate.

The amount of complexing agents included in the immersion plating solutions of the present invention may range from about 5 g/l up to the solubility limit of the complexing agent in the plating solution. Generally, the immersion plating solution will contain the complexing agent in an amount from about 5 g/l to about 150 g/l. In one embodiment, the complexing agent is present in an amount from about 50 g/l to about 140 g/l. In another embodiment, the complexing agent is present in an amount from about 80 g/l to about 120 g/l. In another embodiment, the complexing agent is thiourea, which is present in an amount of about 100 g/l. In another embodiment, the complexing agent is thiourea, which is present in an amount of about 125 g/l. In another embodiment, the complexing agent is 1-methyl-3-propyl-imidazole-2-thione, which is present in an amount of about 80 g/l. When the solubility of the complexing agent is low, a cosolvent may be added to solubilize the complexing agent and thereby enhance its activity in the resulting solution. Suitable cosolvents include water-miscible solvents such as alcohols (e.g., ethanol), glycols (e.g., ethylene glycol), alkoxy alkanols (e.g., 2-butoxy ethanol), ketones (e.g., acetone), aprotic solvents (e.g., dimethylformamide, dimethylsulfoxide, acetonitrile, etc.), etc.

It is within the scope of the invention to optionally include in the immersion plating solution, one or more surfactants compatible with each of the solution soluble metal salts, the acids and the complexing agents. The plating solutions of the present invention may optionally contain at least one surfactant. As noted above, the surfactant may be at least one surfactant including amphoteric, nonionic, cationic, or anionic surfactants; or mixtures thereof. More often, the surfactant is at least one cationic or nonionic surfactant; or mixtures thereof. The nonionic surfactants are preferred.

A variety of nonionic surfactants which can be utilized in the present invention are the condensation products of ethylene oxide and/or propylene oxide with compounds containing a hydroxy, mercapto or primary or secondary amino or amido group, or other nitrogen compound containing at least one N—H group. Examples of materials containing hydroxyl groups include alkyl phenols, styrenated phenols, fatty alcohols, fatty acids, polyalkylene glycols, etc. Examples of materials containing amino groups include alkylamines and polyamines, fatty acid amides, etc.

Examples of nonionic surfactants useful in the plating solutions of the invention include ether-containing surfactants having the Formula V:

$$R\text{—}O\text{—}[(CH_2)_nO]_xH \qquad (V)$$

wherein R is an aryl or alkyl group containing from about 6 to 20 carbon atoms, n is two or three, and x is an integer between 2 and 100. Such surfactants are produced generally by treating fatty alcohols or alkyl or alkoxy substituted phenols or naphthols with excess ethylene oxide or propylene oxide. The alkyl carbon chain may contain from about 14 to 24 carbon atoms and may be derived from a long chain fatty alcohol such as oleyl alcohol or stearyl alcohol.

Nonionic polyoxyethylene compounds of this type are described in U.S. Pat. No. 3,855,085. Such polyoxyethylene compounds are available commercially under the general trade designations SURFYNOL® by Air Products and Chemicals, Inc. of Wayne, Pa., under the designation MACOL®, PLURONIC® or TETRONIC® by BASF Wyandotte Corp. of Wyandotte, Mich., and under the designation SURFONIC® by Huntsman Corporation of Houston, Tex. Examples of specific polyoxyethylene condensation products useful in the invention include MACOL® LA-23 which is the product obtained by reacting about 23 moles of ethylene oxide with 1 mole of lauryl alcohol. Another example is "SURFYNOL® 465" which is a product obtained by reacting about 10 moles of ethylene oxide with 1 mole of tetramethyidecynediol. "SURFYNOL® 485" is the product obtained by reacting 30 moles of ethylene oxide with tetramethyidecynediol. "PLURONIC® L 35" is a product obtained by reacting 22 moles of ethylene oxide with polypropylene glycol obtained by the condensation of 16 moles of propylene oxide. SURFONIC® N-150 is an ethoxylated alkylphenol.

Alkoxylated amine, long chain fatty amine, long chain fatty acid, alkanol amines, diamines, amides, alkanol amides and polyglycol type surfactants known in the art are also useful. One type of amine surfactant found particularly useful in the immersion solutions is the group obtained by the addition of a mixture of propylene oxide and ethylene oxide to diamines. More specifically, compounds formed by the addition of propylene oxide to ethylene diamine followed by the addition of ethylene oxide are useful and are available commercially from BASF under the general trade designation TETRONIC®.

Carbowax-type surfactants which are polyethylene glycols having different molecular weights also are useful. For example CARBOWAX® 1000 has a molecular weight range of from about 950 to 1050 and contains from 20 to 24 ethoxy units per molecule. CARBOWAX® 4000 has a molecular weight range of from about 3000 to 3700 and contains from 68 to 85 ethoxy units per molecule. Other known nonionic glycol derivatives such as polyalkylene glycol ethers and methoxy polyethylene glycols which are available commercially can be utilized as surfactants in the compositions of the invention.

Ethylene oxide condensation products with fatty acids also are useful nonionic surfactants. Many of these are available commercially such as under the general trade name ETHOFAT® from Armak Chemical Division of Akzona, Inc., Chicago, Ill. Examples include condensates of oleic acid, linoleic acid, etc. Ethylene oxide condensates of fatty acid amides, e.g., oleamide, also are available from Armak.

In some of the solutions, improved results are obtained when polyoxyalkylated glycols, phenols and/or naphthols are included. For example ethylene oxide and propylene oxide condensates with aliphatic alcohols, sorbitan alkyl esters, alkyl, alkoxy and styrenated phenols and naphthols are useful additives. About 6 to about 40 moles of the oxide may be condensed with the above identified compound. Many of these condensates are available commercially under such trade names as TWEEN® from ICI America, TRITON® from Rohm & Haas Co., TERGITOL® from Union Carbide, and IGEPAL® from General Aniline and Film Corp.

The surfactants utilized in the immersion plating solutions of the present invention also may be amphoteric surfactants. The preferred amphoteric surfactants include betaines and sulfobetaines, and sulfated or sulfonated adducts of the condensation products of ethylene oxide and/or propylene oxide with an alkyl amine or diamine.

Typical betaines include lauryldimethylammonium betaine and stearyl dimethylammonium betaine. Sulfated and sulfonated adducts include TRITON® QS-15 (Rohm & Haas Co.), a sulfated adduct of an ethoxylated alkylamine, MIRANOL® HS, a sodium salt of a sulfonated lauric derivative, MIRANOL® OS, a sodium salt of a sulfonated oleic acid, etc. Cationic surfactants also are useful in the plating solutions of the present invention and such surfactants may be selected from the group consisting of higher alkyl amine salts, quaternary ammonium salts, alkyl pyridinium salts and alkyl imidazolium salts.

Cationic surfactants obtained by condensation of various amounts of ethylene oxide or propylene oxide with primary fatty amines are useful and may be represented by the following Formula VI:

(VI)

wherein R is a fatty acid alkyl group containing from about 8 to about 22 carbon atoms, $R^1$ is an alkylene radical containing up to about 5 carbon atoms, $R^2$ and $R^3$ are each independently an ethylene or propylene group, a is 0 or 1, and x, y and z are each independently integers from 1 to about 30, and the sum of x, y, and z is an integer of from about 2 to about 50.

More particularly, the alkoxylated amines utilized in the solutions of the invention are represented by the Formulae VII and VIII:

(VII)

(VIII)

wherein $R^4$ is a fatty acid alkyl group containing from 12 to 18 carbon atoms, and x, y and z are as defined in Formula V.

The above described cationic surfactants are known in the art and are available from a variety of commercial sources. The surfactants of the type represented by Formula VII can be prepared by condensing various amounts of ethylene oxide with primary fatty amines which may be a single amine or a mixture of amines such as are obtained by the hydrolysis of tallow oils, sperm oils, coconut oils, etc. Specific examples of fatty acid amines containing from 8 to 22 carbon atoms include saturated as well as unsaturated aliphatic amines such as octyl amine, decyl amine, lauryl amine, stearyl amine, oleyl amine, myristyl amine, palmityl amine, dodecyl amine, and octadecyl amine.

The alkoxylated amines which are useful in the plating solutions of the invention can be prepared as mentioned above, by condensing alkylene oxides with the above-described primary amines by techniques known to those in the art. Many such alkoxylated amines is commercially available from a variety of sources. The alkoxylated amines of the type represented by Formula VII are available from the Armak Chemical Division of Akzona, Inc., Chicago, Ill., under the general trade designation ETHOMEEN®. Specific examples of such products include ETHOMEEN® C/15 which is an ethylene oxide condensate of a coconut fatty amine containing about 5 moles of ethylene oxide; ETHOMEEN® C/20 and C/25 which also are ethylene oxide condensation products from coconut fatty amine containing about 10 and 15 moles of ethylene oxide, respectively; ETHOMEEN® S/15 and S/20 which are ethylene oxide condensation products with stearyl amine containing about 5 and 10 moles of ethylene oxide per mole of amine, respectively; and ETHOMEEN® T/15 and T/25 which are ethylene oxide condensation products of tallow amine containing about 5 and 15 moles of ethylene oxide per mole of amine, respectively. Commercially available examples of the alkoxylated amines of the type represented by formula (5) include ETHODUOMEEN® T/13 and T/20 which are ethylene oxide condensation products of N-tallow trimethylene diamine containing about 3 and 10 moles of ethylene oxide per mole of diamine respectively. Another type of useful cationic surfactant is represented by the Formula IX:

(IX)

where R is an alkyl group containing from about 8 to about 12 carbon atoms, Y is a methyl or a hydroxyl group, m and n are integers, the sum of which is from about 2 to about 20.

The amine ethoxylate surfactants of the type represented by Formula IX exhibit the characteristics of both cationic and nonionic surfactants with the nonionic properties increasing at the higher levels of ethoxylation. That is, as the sum of x and y increases, the ethoxylated amine behaves more like a nonionic surfactant.

The cationic surfactant also may be:

(a) a quaternary ammonium salt of the Formula X:

(X)

wherein X represents a halogen, a hydroxyl group, or the residue of a $C_{1-5}$ alkanesulfonic acid; $R_1$ represents alkyl group R' and R" represent a $C_{1-4}$ alkyl group; and R'" represents a $C_{1-10}$ alkyl group or a benzyl group;

(b) pyridinium salts represented by the general Formula XI:

(XI)

wherein X represents a halogen, a hydroxyl group, or the residue of a $C_{1-5}$ alkanesulfonic acid; $R_1$ represents a $C_{8-20}$ alkyl group; and $R_a$ represents hydrogen or a $C_{1-4}$ alkyl group;

(c) imidazolinium salts represented by the general Formula XII:

(XII)

wherein X represents a halogen, a hydroxyl group, or the residue of a $C_{1-10}$ alkanesulfonic acid; $R_1$ represents a $C_{8-20}$ alkyl group; $R_b$ represents a hydroxy-containing $C_{1-5}$ alkyl group; and R'" represents a $C_{1-10}$ alkyl group or a benzyl group; and (d) higher alkyl amine salts represented by the general Formula XIII:

[$R_1$—$NH_3$]$^{(+)}$$CH_3$—$(CH_2)_n$—$COO^{(-)}$ (XIII)

wherein $R_1$ represents a $C_{8-20}$ alkyl group; and n is from about 0 to about 4.

Examples of the above described cationic surfactants, in the form of salts, are lauryltrimethylammonium salt, cetyltrimethylammonium salt, stearyltrimethylammonium salt, lauryldimethylethylammonium salt, octadecyldimethylethylammonium salt, dimethylbenzyllaurylammonium salt, cetyldimethylbenzylammonium salt, octadecyldimethylbenzylammonium salt, trimethylbenzylammonium salt, triethylbenzylammonium salt, hexadecylpyridinium salt, laurylpyridinium salt, dodecylpicolinium salt, 1-hydroxyethyl-1-benzyl-2-laurylimidazolinium salt, 1-hydroxyethyl-1-benzyl-2-oleylimidazolinium salt, stearylamine acetate, laurylamine acetate, and octadecylamine acetate.

The surfactants also may be anionic surfactants. Examples of useful anionic surfactants include sulfated alkyl alcohols, sulfated lower ethoxylated alkyl alcohols, and their salts such as alkali metal salts. Examples of such surfactants include sodium lauryl sulfate (Duponol C or QC from DuPont), sodium mixed long chain alcohol sulfates available from DuPont under the designation Duponol WN, sodium octyl sulfate available from Alcolac, Ltd. under the designation Sipex OLS, Sodium tridecyl ether sulfate (Sipex EST), sodium lauryl ether sulfate (Sipon ES), magnesium lauryl sulfate (Sipon LM), the ammonium salt of lauryl sulfate (Sipon L-22), diethanolamino lauryl sulfate (Sipon LD), sodium dodecylbenzene sulfonate (SIPONATE® DS), etc.

The surfactant(s) may be present in an amount from about 1 g/l to about 100 g/l. In one embodiment, the surfactant is present in an amount from about 2 g/l to about 20 g/l. In one embodiment, the surfactant is present in an amount from about 5 g/l to about 15 g/l. In another embodiment, the surfactant is present in an amount of about 5 g/l. In another embodiment, the surfactant is present in an amount of about 10 g/l. In another embodiment, the surfactant is present in an amount of about 9.9 g/l. In another embodiment, no surfactant is added to either the immersion tin plating solution or the immersion alloy plating solution. In another embodiment, the surfactant is added only to the immersion tin plating solution. In another embodiment, the surfactant is added only to the immersion alloy plating solution.

The immersion plating solutions of the present invention may also contain one or more chelating agents useful in keeping the immersion platable metal and/or displaced metal in solution. The chelating agents which are useful in the solutions of the present invention generally comprise the various classes of chelating agents and specific compounds disclosed in Kirk-Othmer, Encyclopedia of Chemical Technology, Third Edition, Vol. 5, pp. 339–368. This disclosure is hereby incorporated by reference. Chelating agents that are especially preferred comprise polyamines, aminocarboxylic acids and hydroxy carboxylic acids. Some aminocarboxylic acids that may be used comprise ethylenediaminetetraacetic acid, hydroxyethyletylenediaminetriacetic acid, nitrilotriacetic acid, N-dihydroxyethylglycine, and ethylenebis (hydroxyphenylglycine). Hydroxy carboxylic acids that may be used comprise tartaric acid, citric acid, gluconic acid and 5-sulfosalicylic acid. Other useful chelating agents include polyamines such as ethylene diamine, dimethylglyoxime, diethylenetriamine, etc. The chelating agents may be present in an amount in the range from about 5 g/l to about 50 g/l.

Various secondary reducing agents may be included in the immersion plating solutions of the present invention. The secondary reducing agents may comprise organic aldehydes whether saturated or unsaturated, aliphatic or cyclic, having up to about 10 carbon atoms, borates, hypophosphite salts and hypophosphorous acid. Lower alkyl aldehydes having up to about 6 carbon atoms may be employed in this respect such as formaldehyde, acetaldehyde, propionaldehyde, butyraldehyde, and the like. Especially preferred aldehydes comprise hydroxy aliphatic aldehydes such as glyceraldehyde, erythrose, threose, arabinose and the various position isomers thereof, and glucose and the various position isomers thereof. Glucose has been found to prevent oxidation of the metal salts to a higher oxidation state, e.g., tin (II) ion to tin (IV) ion, but also as a chelating agent and is especially useful for these reasons. Other useful secondary reducing agents include sodium hypophosphite, hypophosphorous acid, dimethylamino borane, and other boranes. The secondary reducing agents may be present in an amount from about 5 g/l to about 110 g/l. In one embodiment, the reducing agent is present in an amount from about 20 g/l to about 60 g/l. In one embodiment, the reducing agent is present in an amount of about 40 g/l.

The immersion plating solutions of the present invention also may contain urea or a urea derivative, homolog or analog thereof. Examples of useful urea derivatives are found in U.S. Pat. No. 4,657,632, which is incorporated herein by reference. Specific examples include urea nitrate, urea oxalate, 1-acetylurea, 1-benzylurea, 1-butylurea, 1,1-diethylurea, 1,1-diphenylurea, 1-hydroxyurea, etc. The urea compound may be present in an amount from in the range from about 10 to about 125 g/l.

The immersion plating solutions of the present invention also may contain one or more amidine compounds. The amidine compounds may be characterized by the Formula XIV:

$$RC(=NH)NH_2 \qquad (XIV)$$

and the acid salts thereof wherein R is hydrogen, a hydroxyl group, an aliphatic, alicyclic, aromatic or heterocyclic group, an amino group, an amidino group, and amidinoaryl group, a carboxyalkyl group, or an —NHR' group wherein R' is an aliphatic, alicyclic, aminoalkyl, amidoalkyl or carboxyalkyl group.

The acid salts include salts such as the formates, acetates, hydrochlorides, carbonates, etc. of such amidines. The aliphatic and alkyl groups contain from one to about 10 or more carbon atoms, whereas the alicyclic and aromatic (or aryl) groups contain from about 6 to about 20 or more carbon atoms, and the heterocyclic groups contain from about 4 to about 20 carbon atoms.

Examples of such amidines are as follows. The list is exemplary only and is not to be considered as a limitation on the above formula.

| R | Formula | Name |
|---|---|---|
| Hydrogen | H—C(=NH)NH$_2$ | formamidine |
| Hydroxyl | HO—C(=NH)NH$_2$ | isourea |
| Aliphatic | CH$_3$C(=NH)NH$_2$ | ethanamidine |
| | CH$_2$CH$_3$ | 4-ethylhexanamidine |
| | CH$_3$CH$_2$CH—CH$_2$CH$_2$C(=NH)NH$_2$ | |
| Alicyclic |  | Cyclohexanecarboxamidine |
| |  | Pyrrole-2-carboxamidine |
| Heterocyclic |  | 2,6-diazanaphthalene-3,7-Dicarboxamide |
| Aromatic |  | 2-naphthamidine |
| |  | Benzamidine |
| Amino | H$_2$N—C(—NH)NH$_2$ | guanidine |
| Aminoalkyl | H$_2$NCH$_2$CH$_2$C(=NH)NH$_2$ | 1-aminopropanamidine |
| Amidinoalkyl | H$_2$N(HN=)C(CH$_2$)$_3$C(=NH)NH$_2$ | pentanediamidine |
| Amidino | H$_2$N(HN=)C—C(=NH)NH$_2$ | ethanediamidine |
| Amidinoaryl | H$_2$N(HN=)C—C$_6$H$_4$—C(=NH)NH$_2$ | 1,4-benzenedicarboxamidine |
| Carboxyalkyl | H$_2$N(HN=)C(CH$_2$)$_3$COOH | 4-carbaminidoylbutanoicacid |
| R$^1$ = | | |
| Aliphatic | CH$_3$NH C(=NH)NH$_2$ | methyl guanidine |
| Alicyclic |  | Cyclohexyl guanidine |
| Amidino | H$_2$N(HN=)C—NH—C(=NH)NH$_2$ | biguanide |
| Aminoalkyl | H$_2$N(CH$_2$)$_4$NH—C(=NH)NH$_2$ | aminobutylguanidine |

-continued

| R | Formula | Name |
|---|---|---|
| Carboxylalkyl | H₂N(HN=)C—NH—CH₂COOH | 3-guanidinoacetic acid |
| | H₂N(HN=)C—NH—(CH₂)₂COOH | 3-guanidinobutanoic acid |
| amidoalkyl | H₂N(HN=)C—NH—CH₂CH₂CONH₂ | 3-guanidino propionamide |
| Heterocyclic |  | 2-guanidinobenzimidazole |

The amount of amidine compound included in the plating baths of the invention may vary over a wide range such as from about 1 gram per liter of bath up to about 100 grams per liter of bath.

In one preferred embodiment, the plating solutions of this invention are substantially free of thiourea and thiourea derivatives.

The various components of the immersion plating solutions useful in the method of the present invention may be present at the concentrations described above. In one embodiment, the immersion plating solution will contain:
  about 1 g/l to about 150 g/l of each immersion-platable metal;
  about 5 g/l to about 150 g/l of the complexing agent compound; and
  about 20 g/l to about 500 g/l of the acid.

The solution also may contain:
  about 1 g/l to about 100 g/l of a surfactant;
  about 10 g/l to about 125 g/l of a urea or amidine compound;
  about 5 g/l to about 40 g/l of a chelating agent; and
  about 5 g/l to about 110 g/l of a secondary reducing agent.

The solution concentrations may, of course, vary depending on the particular plating application intended.

The immersion plating solutions useful in the method of this invention can be prepared by adding the components to water. The components can be added in any order.

The present invention provides a method of preserving solderability and inhibiting tin whisker growth of tin coated copper or copper alloy surfaces on a substrate. The method comprises the steps of:
  (A) preparing an immersion tin plating solution;
  (B) applying the immersion tin plating solution to the substrate to form a tin coating on the surfaces;
  (C) preparing an immersion alloy plating solution containing at least two immersion-platable metals;
  (D) applying the immersion alloy plating solution to the substrate to form an alloy cap layer on the tin coating.

The plating times may vary in accordance with the desired thickness of the deposited metal coating or layer. In one embodiment, the substrate is immersed in the immersion tin plating solution for a period in the range from about 5 minutes to about 60 minutes. In another embodiment, the substrate is immersed in the immersion tin plating solution for a period in the range from about 10 minutes to about 20 minutes.

In one embodiment, the substrate is immersed in the immersion alloy plating solution for a period in the range from about 1 minute to about 10 minutes. In another embodiment, the substrate is immersed in the immersion alloy plating solution for a period in the range from about 2 minutes to about 5 minutes.

The methods of the present invention, employing the above-described aqueous electroless plating solutions may be utilized in the plating of substrates such as copper, copper alloys, and other metals by electroless plating, also referred to as chemical displacement. The application steps may include immersing or dipping the substrate in the plating solution, or may include spraying, flooding or cascading the solution onto the substrate, or may include combinations of these methods.

In one embodiment, metal substrates are contacted with the plating solutions by immersing or dipping the substrates into the plating solutions maintained at a temperature of from about 15° C. to about 80° C. In another embodiment, the temperature of the plating solution is in the range of from about 35° C. to about 65° C. The metal substrate to be plated generally is maintained in the immersion tin plating solution for about 5 to about 60 minutes to provide the desired tin coating quality and thickness such as tin coating thicknesses of from about 30 to about 300 microinches. The tin-coated metal substrate to be plated generally is maintained in the immersion alloy plating solution for about 1 to about 10 minutes to provide the desired alloy cap layer quality and thickness such as alloy cap layer thicknesses of from about 1 to about 30 microinches. The plating solutions may be stirred mechanically or ultrasonically to accelerate the displacement reaction.

As noted above, the metal layers deposited with the above plating solutions include a first coating of substantially only tin and a cap layer of an immersion platable metal alloy, which alloy includes at least two immersion platable metals selected from tin, silver, bismuth, copper, nickel, lead, zinc, indium, palladium, platinum, gold, cadmium, ruthenium and cobalt.

In one embodiment, the tin coating has a thickness in the range from about 20 microinches to about 300 microinches. In another embodiment, the tin coating has a thickness in the range from about 25 microinches to about 100 microinches. In another embodiment, the tin coating has a thickness in the range from about 30 microinches to about 80 microinches. In another embodiment, the tin coating has a thickness in the range from about 40 microinches to about 60 microinches. In another embodiment, the tin coating has a thickness of about 50 microinches. In another embodiment, the tin coating has a thickness of about 45 microinches.

In one embodiment, the alloy cap layer has a thickness in the range from about 1 microinch to about 30 microinches. In another embodiment, the alloy cap layer has a thickness in the range from about 2 microinches to about 10 microinches. In another embodiment, the alloy cap layer has a thickness in the range from about 4 microinches to about 8 microinches. In another embodiment, the alloy cap layer has a thickness in the range from about 4 microinches to about 15 microinches. In another embodiment, the alloy cap layer has a thickness of about 10 microinches.

The metal layers produced by the methods of the invention are dense and adhere tightly to the underlying metal substrate, and remain free of tin whiskers even when subjected to elevated temperatures for extended periods. In one embodiment, after forming the alloy cap layer, the substrate remains free of physical change, deposits or substances (such as oxides of copper) which may interfere with soldering even when subjected to elevated temperatures for extended periods. In another embodiment, the deposited tin coating and alloy cap layer remains solderable and free of tin whiskering when subjected to elevated temperatures conditions for extended periods. As a result, the substrate, such as a PCB, when coated with the tin coating and alloy cap layer of the present invention, remains solderable for a period of at least one year, as estimated based on a determination by the Siemens solderability test. The Siemens solderability test is a standard test in the industry in which the test substrate is subjected to a temperature of 155° C. for a period of 4 hours. At the end of the period, the substrate is tested for solderability, generally by dipping the substrate into molten solder and observing if any conductors fail to be evenly coated with the solder.

Whether a substrate coated with tin or comprising tin develops tin whiskering may be determined by subjecting the tin-coated substrate to a temperature of about 130° C. for a period of about 70 hours. Although RDHBIT was previously considered to be whisker-free, the present inventor discovered that a RDHBIT coating does not pass this test. The present inventor has discovered that embodiments of the present invention pass this test.

The following provides exemplary solutions which are useable in the method of the present invention, and provides examples which illustrate the method of the present invention. Unless otherwise indicated in the following examples and elsewhere in the specification and claims, all parts and percentages are by weight, temperatures are in degrees centigrade, pressure is at or near atmospheric pressure, and all ranges and ratio limits may be combined.

The methods of the present invention provide a coating on a substrate such as a PCB which avoids whiskering and preserves solderability. When PCBs coated according to the methods of the present invention are subjected to simulated storage conditions in the above-described tests, the results of the tests show that the method of the finished PCBs having copper or copper alloy surfaces having a final finish comprising a first coating of tin and a cap layer of an alloy of at least two immersion platable metals remains solderable and whisker free, whereas the same PCBs having copper or copper alloys coated with only a coating of tin develop whiskers and suffer from reduced solderability, after both surfaces are exposed to simulated extended storage conditions.

The following illustrates some immersion platable solutions useful in the method of the present invention. The quantities of the metals in the following solution are given in the concentration of the metal (or metal ion) in the solution. These metals are added in the form of the indicated compounds. For example, a solution containing 33 g/l tin is formed by dissolving 111.3 g of tin methane sulfonate in water to make one liter of tin solution. The following solutions are exemplary only, and the invention is not so limited.

|  | g/l |
|---|---|
| Solution A | |
| tin (added as stannous methane sulfonate) | 33.0 |
| methane sulfonic acid | 71.2 |
| thiourea | 125.2 |
| tartaric acid | 25.1 |
| citric acid (anhydrous) | 350.3 |
| sodium hypophosphite | 39.7 |
| MACOL ® LA-23 | 9.9 |
| water | 537.3 |
| Solution B-1 | |
| tin (added as stannous methane sulfonate) | 33.0 |
| lead (added as plumbous methane sulfonate) | 10.0 |
| methane sulfonic acid | 71.2 |
| thiourea | 125.2 |
| tartaric acid | 25.1 |
| citric acid (anhydrous) | 350.3 |
| sodium hypophosphite | 39.7 |
| MACOL ® LA-23 | 9.9 |
| water | 537.3 |
| Solution B-2 | |
| tin (added as stannous methane sulfonate) | 33.0 |
| indium (added as indium methane sulfonate) | 5.0 |
| methane sulfonic acid | 71.2 |
| thiourea | 125.2 |
| tartaric acid | 25.1 |
| citric acid (anhydrous) | 350.3 |
| MACOL ® LA-23 | 9.9 |
| water | 537.3 |
| Solution B-3 | |
| tin (added as stannous sulfate) | 37.0 |
| bismuth (added as bismuth methane sulfonate) | 5.0 |
| sulfuric acid | 150.0 |
| thiourea | 110.0 |
| MACOL ® LA-23 | 5.0 |
| water | to 1 liter |
| Solution B-4 | |
| bismuth (added as bismuth methane sulfonate) | 5.0 |
| tin (added as stannous fluoborate) | 30.0 |
| fluoboric acid | 100.0 |
| thiourea | 100.0 |
| water | to 1 liter |
| Solution B-5 | |
| tin (added as stannous methane sulfonate) | 33.0 |
| indium (added as indium methane sulfonate) | 5.0 |
| silver (added as silver methane sulfonate) | 3.0 |
| methane sulfonic acid | 71.2 |
| thiourea | 125.2 |
| tartaric acid | 25.1 |
| citric acid (anhydrous) | 350.3 |
| MACOL ® LA-23 | 9.9 |
| water | to 1 liter |
| Solution B-6 | |
| bismuth (added as bismuth methane sulfonate) | 3.0 |
| tin (added as stannous methane sulfonate) | 33.0 |
| methane sulfonic acid | 100.0 |
| citric acid (anhydrous) | 300.0 |
| 1-methyl-3-propyl-imidazole-2-thione | 80.0 |
| MACOL ® LA-23 | 9.9 |
| water | to 1 liter |
| Solution B-7 | |
| silver (added as silver nitrate) | 1.0 |
| tin (added as stannous methane sulfonate) | 1.0 |
| methane sulfonic acid | 20.0 |
| histidine | 1.0 |
| 3,5-dinitrosalicylic acid | 1.0 |
| water | to 1 liter |

-continued

| | g/l |
|---|---|
| Solution B-8 | |
| silver (added as silver methane sulfonate) | 20.0 |
| indium (added as indium methane sulfonate) | 10.0 |
| methane sulfonic acid | 100.0 |
| thiourea | 100.0 |
| water | to 1 liter |

The following Examples illustrate use of the above-described solutions A and B-1 to B-8, applied to a copper or copper alloy surface. Tin whiskering test results are indicated for some of the Examples.

EXAMPLE 1

A first coating of tin is applied to the exposed copper surfaces of a PCB from Solution A, plating time 10 minutes at 65° C., resulting in a coating of tin having a thickness of 50 μin, followed by an alloy cap layer applied to the tin coating from Solution B-1, plating time 2 minutes at 65° C., resulting in a layer of tin/lead alloy having a thickness of 10 μin. No whiskers were produced after 70 hours at 130° C.

EXAMPLE 2

A first coating of tin is applied 1 to the exposed copper surfaces of a PCB from Solution A, plating time 9 minutes at 65° C., resulting in a coating of tin having a thickness of 45 μin, followed by an alloy cap layer applied to the tin coating from Solution B-2, plating time 2 minutes at 65° C., resulting in a layer of tin/indium alloy having a thickness of 10 μin. No whiskers were produced after 70 hours at 130° C.

EXAMPLE 3

A first coating of tin is applied to the exposed copper surfaces of a PCB from Solution A, plating time 10 minutes at 65° C., resulting in a coating of tin having a thickness of 50 μin, followed by an alloy cap layer applied to the tin coating from Solution B-3, plating time 2 minutes at 65° C., resulting in a layer of tin/bismuth alloy having a thickness of 10 μin. No whiskers were produced after 70 hours at 130° C.

EXAMPLE 4

A first coating of tin is applied to the exposed copper surfaces of a PCB from solution A, plating time 9 minutes at 65° C., resulting in a coating of tin having a thickness of 45 μin, followed by an alloy cap layer applied to the tin coating from Solution B-4, plating time 4 minutes at 40° C., resulting in a layer of tin/bismuth alloy having a thickness of 10 μin.

EXAMPLE 5

A first coating of tin is applied to the exposed copper surfaces of a PCB from Solution A, plating time 10 minutes at 65° C., resulting in a coating of tin having a thickness of 50 μin, followed by an alloy cap layer applied to the tin coating from Solution B-5, plating time 3 minutes at 50° C., resulting in a layer of tin/indium/silver alloy having a thickness of 10 μin.

EXAMPLE 6

A first coating of tin is applied to the exposed copper surfaces of a PCB from Solution A, plating time 10 minutes at 65° C., resulting in a coating of tin having a thickness of 50 μin, followed by an alloy cap layer applied to the tin coating from Solution B-6, plating time 2 minutes at 65° C., resulting in a layer of tin/bismuth alloy having a thickness of 10 μin.

EXAMPLES 7

A first coating of tin is applied to the exposed copper surfaces of a PCB from Solution A, plating time 10 minutes at 65° C., resulting in a coating of tin having a thickness of 50 μin, followed by an alloy cap layer applied to the tin coating from Solution B-7, plating time 2 minutes at 65° C., resulting in a layer of tin/silver alloy having a thickness of 8 μin. The tin/silver alloy contains approximately 90 wt % silver. No whiskers were produced after 70 hours at 130° C.

EXAMPLE 8

A first coating of tin is applied to the exposed copper surfaces of a PCB from Solution A, plating time 10 minutes at 65° C., resulting in a coating of tin having a thickness of 50 μin, followed by an alloy cap layer applied to the tin coating from Solution B-8, plating time 2 minutes at 65° C., resulting in a layer of tin/silver alloy having a thickness of 8 μin. The tin/silver alloy contains approximately 90 wt % silver.

Comparative Example

A single coating of tin from Solution A is applied to the exposed copper surfaces of a PCB, plating time 10 minutes at 65° C., tin thickness 50 μin. No alloy cap layer is applied. Whiskers were produced in less than 70 hours at 130° C.

The coating or layer deposited from the plating solutions by the methods of the invention are useful in the electronic circuits, electronic devices and electrical connectors. The first coating is of tin, and the second or subsequent cap layer of an alloy of at least two immersion platable metals selected from tin, silver, bismuth, copper, nickel, lead, zinc, indium, palladium, platinum, gold, cadmium, ruthenium and cobalt. The coating or layer can be used as protective layers to maintain and preserve solderability while at the same time preventing tin whiskering by the tin layer. In addition, the layers prevent corrosion of copper in a patterning procedure during the fabrication of printed circuits or integrated circuits. The coating or layer maintain and preserve solderability by providing chemically stable surfaces on printed wireboards, etc.

The methods of the present invention are useful in the manufacture of multilayer printed circuit boards which have alternating layers of dielectric material which support copper circuitry (which may have other layers such as a copper sheet interspaced which serves as a ground plane) which are adhered to an insulating layer through intermediate layers. The circuit board has conductive through holes which form electrical paths across the entire thickness of the board. Multilayer circuit boards may comprise several dozen conductive and non-conductive layers. In the formation of multilayer circuit boards, it is often necessary to drill holes through the boards, and defects can occur due to delamination of layers in the areas immediately surrounding a hole.

A starting material is a dielectric layer which contains a cladding of copper on one or both surfaces. The copper layer may have a total thickness in the range from about 4 microns up to about 128 microns. In one embodiment, the copper is ¼ ounce foil, i.e., it weighs ¼ ounce per square foot, and is about 8 microns thick. In another embodiment, the copper is ½ ounce foil, and is about 16 microns thick. In another embodiment, the copper is ¾ ounce foil, and is about 24 microns thick. In another embodiment, the copper is 1 ounce foil, and is about 32 microns thick. In another embodiment, the copper is 2 ounce foil, and is about 64 microns thick. In another embodiment, the copper foil has electrodeposited thereon a layer of copper about 1 micron thick. This electrodeposited copper may be used to form the interconnections between conductive layers of the PCB through the conductive holes. The copper or copper alloy layer may be used to form conductive circuitry. Well known techniques can be employed to form such circuitry.

The composition of the dielectric layer is not critical provided it functions as an electrical insulator. After formation of the conductive circuitry, when a finished PCB has been prepared, a final finish is applied according to the method of the present invention. In the method of the present invention, a first, relatively heavy, coating of tin is applied to the exposed copper or copper alloy circuitry of the finished PCB, followed by a second, relatively light, outer or cap layer of an alloy of at least two immersion platable metals selected from tin, silver, bismuth, copper, nickel, lead, zinc, indium, palladium, platinum, gold, cadmium, ruthenium and cobalt, which is applied to the tin coating. The circuitry of the printed circuit board typically is first cleaned and etched before it is contacted with the plating solutions of the present invention.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A printed circuit board comprising
   electrical circuitry formed on an outer surface of the printed circuit board, the circuitry comprising copper or a copper alloy;
   a final finish on the circuitry, the final finish comprising
   a coating of immersion-plated tin on the copper or copper alloy circuitry; and
   an alloy cap layer on the tin coating, the alloy cap layer comprising at least two immersion-plated metals.

2. The printed circuit board of claim 1, wherein the at least two immersion-plated metals are selected from tin, silver, bismuth, copper, nickel, lead, zinc, indium, palladium, platinum, gold, cadmium, ruthenium and cobalt.

3. The printed circuit board of claim 2, wherein one of the at least two immersion-plated metals is tin.

4. The printed circuit board of claim 1, wherein the at least two immersion-plated metals comprise tin and silver.

5. The printed circuit board of claim 1, wherein the tin coating has a thickness in the range from about 20 microinches to about 300 microinches.

6. The printed circuit board of claim 1, wherein the tin coating has a thickness in the range from about 40 microinches to about 60 microinches.

7. The printed circuit board of claim 1, wherein the alloy cap layer has a thickness in the range from about 1 microinch to about 30 microinches.

8. The printed circuit board of claim 1, wherein the alloy cap layer has a thickness in the range from about 2 microinches to about 10 microinches.

9. The printed circuit board of claim 1, wherein the circuitry is substantially free of tin whiskers.

10. The printed circuit board of claim 1, wherein the circuitry remains free of tin whiskers for at least 70 hours at 130° C.

11. The printed circuit board of claim 1, wherein the circuitry remains solderable for at least one year.

12. A printed circuit board comprising
    electrical circuitry formed on an outer surface of the printed circuit board, the circuitry comprising copper or a copper alloy;
    a final finish on the circuitry, the final finish comprising
    a coating of immersion-plated tin on the copper or copper alloy circuitry; and
    an alloy cap layer on the tin coating, the alloy cap layer comprising tin and at least one immersion-plated metal other than tin.

13. The printed circuit board of claim 12, wherein the immersion-plated metal other than tin is selected from silver, bismuth, copper, nickel, zinc, indium, palladium, platinum, gold, cadmium, ruthenium and cobalt.

14. The printed circuit board of claim 12, wherein the tin alloy cap layer comprises from about 50 wt % to about 98 wt % tin.

15. The printed circuit board of claim 12, wherein the tin alloy cap layer comprises from about 80 wt % to about 95 wt % tin.

16. The printed circuit board of claim 12, wherein the at least one immersion-plated metal is silver.

17. The printed circuit board of claim 16, wherein the tin alloy cap layer comprises from about 50 wt % to about 98 wt % silver.

18. The printed circuit board of claim 16, wherein the tin alloy cap layer comprises from about 80 wt % to about 95 wt % silver.

19. The printed circuit board of claim 12, wherein the circuitry is substantially free of tin whiskers.

20. The printed circuit board of claim 12, wherein the circuitry remains free of tin whiskers for at least 70 hours at 130° C.

21. The printed circuit board of claim 12, wherein the circuitry remains solderable for at least one year.

22. A printed circuit board comprising
    electrical circuitry formed on an outer surface of the printed circuit board, the circuitry comprising copper or a copper alloy;
    a final finish on the circuitry, the final finish comprising
    a coating of tin on the copper or copper alloy circuitry; and
    an alloy cap layer on the tin coating,
    wherein the final finish is formed by a process comprising the steps of:
    (A) preparing an immersion tin plating solution;
    (B) applying the immersion tin plating solution to the circuitry to form the coating of tin;
    (C) preparing an immersion alloy plating solution containing at least two immersion-platable metals;
    (D) applying the immersion alloy plating solution to the circuitry to form the alloy cap layer on the coating of tin.

23. The printed circuit board of claim 22, wherein the at least two immersion-platable metals are selected from tin, silver, bismuth, copper, nickel, lead, zinc, indium, palladium, platinum, gold, cadmium, ruthenium and cobalt.

24. The printed circuit board of claim 22, wherein the at least two immersion platable metals comprise tin and silver.

25. The printed circuit board of claim 22, wherein the immersion tin plating solution comprises a stannous salt of a hydrocarbyl-substituted sulfonic acid, the hydrocarbyl-substituted sulfonic acid, a complexing agent and water.

26. The printed circuit board of claim 22, wherein the immersion alloy plating solution comprises at least two immersion-platable metal salts of a hydrocarbyl-substituted sulfonic acid, the hydrocarbyl-substituted sulfonic acid, a complexing agent and water.

27. The printed circuit board of claim 22, wherein following formation of the alloy cap layer, the circuitry is substantially free of tin whiskers.

28. The printed circuit board of claim 22, wherein the circuitry remains free of tin whiskers for at least 70 hours at 130° C.

29. The printed circuit board of claim 22, wherein the circuitry remains solderable for at least one year.

* * * * *